United States Patent
Messina et al.

(10) Patent No.: US 6,778,393 B2
(45) Date of Patent: Aug. 17, 2004

(54) COOLING DEVICE WITH MULTIPLE COMPLIANT ELEMENTS

(75) Inventors: Gaetano P. Messina, Hopewell Junction, NY (US); Lawrence S. Mok, Brewster, NY (US); Tsorng-Dih Yuan, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 35 days.

(21) Appl. No.: 10/308,225

(22) Filed: Dec. 2, 2002

(65) Prior Publication Data

US 2004/0105234 A1 Jun. 3, 2004

(51) Int. Cl.⁷ .............................................. H05K 7/20
(52) U.S. Cl. .................... 361/699; 165/80.4; 174/15.1; 257/714; 361/689
(58) Field of Search .............. 165/80.4, 185; 174/15.1; 257/714; 361/688–689, 698–699

(56) References Cited

U.S. PATENT DOCUMENTS

| | | | |
|---|---|---|---|
| 4,193,445 A | * | 3/1980 | Chu et al. ................... 165/79 |
| 4,498,530 A | | 2/1985 | Lipschutz |
| 4,882,654 A | * | 11/1989 | Nelson et al. ............. 361/701 |
| 5,016,090 A | | 5/1991 | Galyon et al. |
| 5,023,695 A | | 6/1991 | Umezawa et al. |
| 5,052,481 A | | 10/1991 | Horvath et al. |
| 5,166,863 A | * | 11/1992 | Shmunis .................... 361/699 |
| 5,170,319 A | | 12/1992 | Chao-Fan Chu et al. |
| 5,239,443 A | | 8/1993 | Fahey et al. |
| 5,294,830 A | | 3/1994 | Young et al. |
| 5,309,319 A | | 5/1994 | Messina |
| 5,420,753 A | | 5/1995 | Akamatsu et al. |
| 5,463,528 A | * | 10/1995 | Umezawa .................. 361/699 |
| 5,537,291 A | | 7/1996 | Onodera et al. |
| 5,774,334 A | * | 6/1998 | Kawamura et al. ......... 361/699 |
| 6,111,749 A | | 8/2000 | Lamb et al. |

OTHER PUBLICATIONS

IBM Technical Disclosure Bulletin, vol. 29, No. 7. Dec. 1986, p. 2887. entitled "Liquid–Cooled Circuit Package with Jet Impinging On Heat Sink Held Against Semiconductor Chip That Is Sealed From The Jet", by V. M. Antonetti et al.

* cited by examiner

Primary Examiner—Gregory D. Thompson
(74) Attorney, Agent, or Firm—Daniel P. Morris; David Aker

(57) ABSTRACT

A cooling device having a common cooling distribution unit with multiple compliant cooling elements. Mechanisms are built in to ensure the cooling elements are in good thermal contact with heat generating semiconductor chips of different heights and sizes on a common carrier. The cooling distribution unit has protection structures to prevent the leakage of coolant from the unit. Further reduction of the risk of accidental coolant leakage is provided with the onboard storage of coolant absorbent materials in the coolant distribution unit. The cooling elements have serpentine coolant channels to enhanced the cooling capacity. The compliance of the cooling elements can also be achieved by using concentric tubing to connect the coolant distribution unit to cooling heads on the cooling elements.

20 Claims, 3 Drawing Sheets

COOLING DEVICE WITH MULTIPLE COMPLIANT ELEMENTS

FIELD OF THE INVENTION

This invention is in the field of heat transfer and cooling of semiconductor chips used in computer and telecommunication equipment. More particularly, this invention is directed to the constructing of a cooling device for semiconductor circuit chips soldered or socketed on a common carrier such as a printed-wiring board or multichip module, and for a method of assembly of such a device and with the devices to be cooled.

BACKGROUND OF THE INVENTION

The problem that this invention intends to solve is an improved heat conduction device to carry heat from a plurality of heat generating semiconductor devices on a common carrier. The size and height of the semiconductor devices vary as well as the top surfaces of the semiconductor devices are also not in the same plane.

Specifically, in the case of semiconductor integrated circuits, the circuit chips are interconnected to the next level of printed-wiring card/boards assembly using any type of chip packaging methods such as column, ball, or land grid arrays. The variation of the height among the many interconnecting elements can be as large as 0.25 mm. Such variations can cause uneven surface requirements for a common cold plate or heat sink solutions mentioned in previously issued patents. Such patents includes the following U.S. Pat. Nos. 5,239,443, 5,309,319, 5,023,6959 5,294, 830, 5,170,319, 5,420,753, 5,537,291, 5,016,090, 6,111,749, 5,052,481, and 4,498,530.

SUMMARY OF THE INVENTION

It is therefore an object of the present invention to provide a cooling device for semiconductor circuit chips soldered or socketed on a common carrier such as a printed-wiring board or multichip module.

It is a further object of the invention to provide a method of constructing such a cooling device.

The exemplary cooling device according to the invention may comprise one coolant distribution unit and multiple compliant cooling elements in contact with multiple semiconductor chips on a common carrier. The invention uses a flexible structure inside the coolant distribution unit coupling with the cooling elements to provide the needed compliance when the cooling elements are in contact with the semiconductor chips. Mechanisms are included in the cooling device to prevent coolant leakage to the outside of the cooling device. Flexible concentric tubing may be used to deliver and collect coolant from the cooling elements while providing the needed compliance.

In accordance with the invention, an apparatus for cooling a plurality of devices, comprises a bottom plate; a cover; a first flexible member supported in the cover, the first flexible member having first openings therein; a second flexible coolant blockage member supported between the cover and the bottom plate, the second flexible coolant blockage member having second openings aligned with the first openings; respective cooling elements having first portions extending through the first openings and second portions extending through the second openings, each of the cooling elements having a cooling surface for contacting a device to be cooled; coolant tight seals for sealing the first portions of the cooling elements to the support member and the second portion of the cooling elements to the coolant blockage member; and coolant flow channels formed in the cover and the cooling elements to allow flow of coolant to cool the cooling elements.

The apparatus can further comprise a mechanical bias element for biasing the cooling elements away from the cover. The cooling elements may further comprise a motion stop portion for interacting with the bottom plate to limit movement of the cooling element away from the cover caused by the bias element. The cover may comprise a cover plate; and a frame member, the first flexible member being supported between the cover plate and the frame member.

The coolant flow channels in each cooling element include an opening for receiving cooling fluid from the cooling channels in the cover, a serpentine coolant flow passage adjacent the surface contacting the devices to be cooled, and a coolant outlet passage for discharging coolant to flow through an outlet passage in the cover. The cooling elements comprise a first part having a series of fins and a second part having a series of grooves. The grooves in the first part and the groves in the second part mate together to form a serpentine channel for the passage of coolant.

The coolant tight seals comprise first annular grooves in the first portions of the cooling elements and second annular grooves in the second portions of the cooling elements; and first annular projections extending from the first flexible member into the first annular grooves, and second annular projections extending from the second flexible member into the second annular grooves. The coolant tight seals may further comprise annular seal bands surrounding portions of the first flexible member and portions of the second flexible member in proximity to the projections.

The second flexible member, the bottom plate, and the cooling elements may define cavities or chambers in which coolant absorbent material may be placed. The coolant absorbent material may be selected from any type of desiccants such as silica gel, calcium aluminosilicate, polyacrylamide, etc.

The apparatus may be combined with a carrier having thereon a plurality of devices to be cooled, at least some of the devices being disposed on the carrier so as to come into contact with the cooling surfaces of the cooling elements.

The invention is also directed to an apparatus for cooling a plurality of devices, comprising a housing; a bottom plate disposed in the housing, the bottom plate having first openings therein; a cover plate for closing the housing; a second plate supported in the housing between the bottom plate and the cover plate to define a first space between the cover plate and the second plate and a second space between the second plate and the bottom plate, the second plate having second openings therein, the second openings being aligned with respective first openings; an outer cooling element for contacting each of the devices to be cooled; an outer tube for connecting each of the outer cooling elements to the bottom plate, each of the outer tubes being received in a respective one of the second openings; an inner cooling element received within the outer cooling element, each of the inner cooling elements having a connecting opening; an inner tube within each of the outer tubes for connecting each of the second cooling elements to the second openings so as to define a flow space between the inner tube and the outer tube; whereby a path for flow of coolant is defined extending along the first space, the inner tube, the connecting opening, the flow space, and the second space.

The second openings have an enlarged region to define an annular space between the outer tube and the bottom plate.

The apparatus further comprises a seal disposed between the outer cooling element and a wall of the enlarged region so as to close the annular space. A coolant absorbing material may be disposed in the annular space. The coolant absorbent material is selected from any type of desiccants such as silica gel, calcium aluminosilicate, polyacrylamide, etc.

The outer cooling elements and the walls of the opening may each be configured with corresponding annular grooves, and the seal comprises an O-ring having portions disposed in the grooves. The inner tubes and the outer tubes are comprised of a resilient material.

The invention is also directed to a method of assembling a cooling apparatus to a carrier having devices to be cooled. The method comprises partially evacuating at least one chamber in the cooling apparatus so as to move cooling elements in a direction and to a position wherein cooling surfaces of the cooling devices can not contact the devices when the cooling apparatus and the carrier are assembled; placing the cooling apparatus over the carrier; and allowing fluid to enter the at least one chamber so that the cooling surfaces are forced into contact with the devices.

The cooling apparatus may be placed over the carrier by sliding the cooling apparatus and the carrier with respect to one another in a direction parallel to a plane of the carrier.

BRIEF DESCRIPTION OF THE DRAWINGS

These and other aspects, features, and advantages of the present invention will become apparent upon further consideration of the following detailed description of the invention when read in conjunction with the drawing figures, in which.

DESCRIPTION OF THE INVENTION

Figure 1:
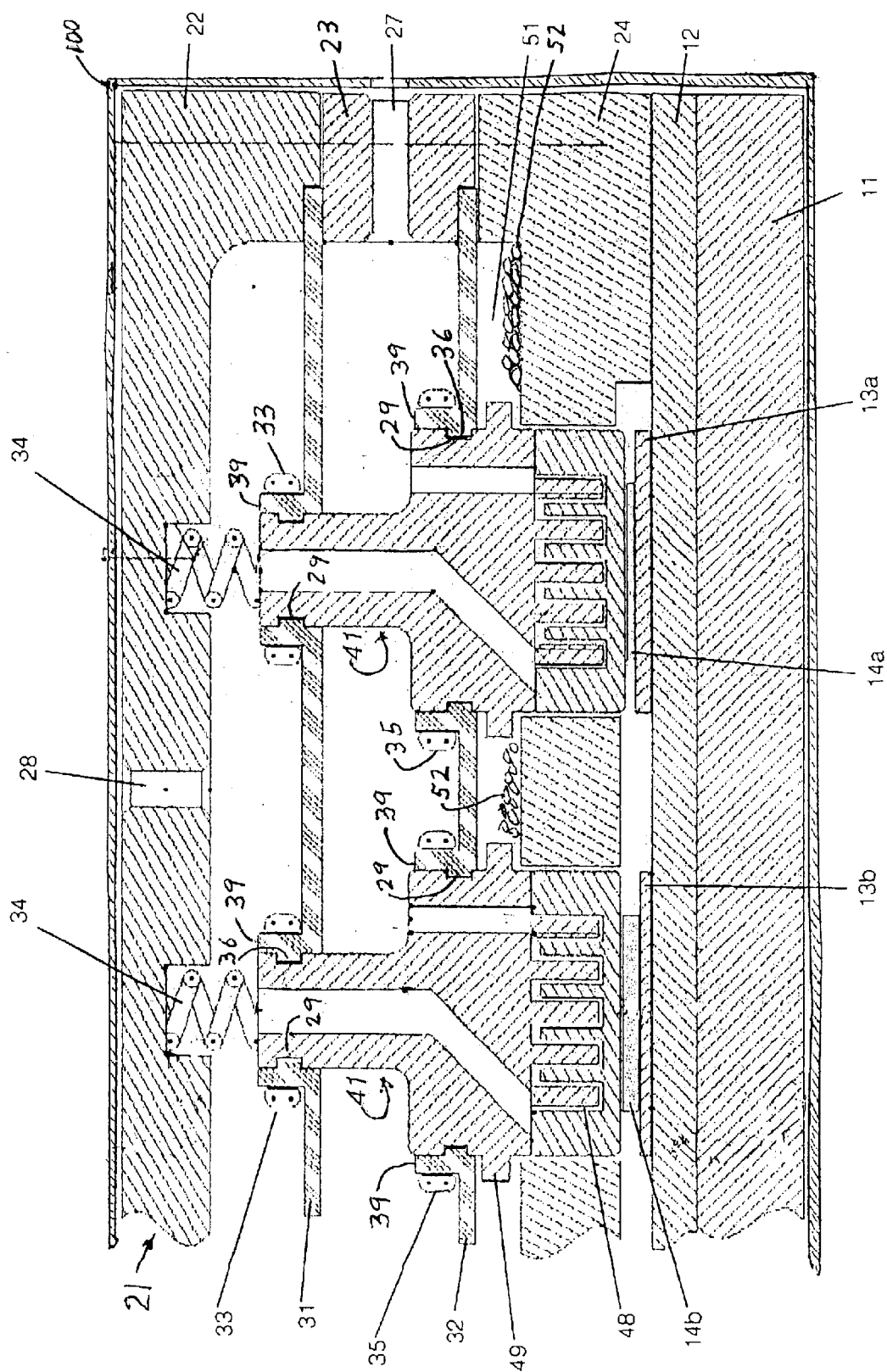
FIG. 1 is an enlarged cross-sectional view of a portion of the cold plate with compliant cooling elements in accordance with the invention, assembled to a circuit board having devices which are cooled.

As shown in FIG. 1, a multiple chip carrier 11 has a circuit board 12 having several layers of printed-wires (not shown) to electrically connect multiple chips 14a and 14b to each other and/or to external circuitry (not shown). The chips 14a and 14b are placed in their respective sockets 13a and 13b. As shown in FIG. 1, the size and height of the chips are quite different, but in general, at least a portion of, and in some cases all of the chips on circuit board 12 may need to be cooled.

A common coolant distribution unit 21 in accordance with the invention is mounted on the multiple chip carrier 11. The coolant distribution unit 21 may comprise a main top cover 22, a main central frame member 23, and one main bottom plate 24. These components may be formed of a metal or polymer. Top cover 22 has one or more coolant inlet ports 28, while frame member 23 has one or more coolant outlet ports 27, to which coolant delivery and removal conduits (not shown), attached by appropriate fittings (also not shown) bring coolant to and remove coolant from unit 21. The coolant may be one of several fluids, such as water, an appropriate oil (such as a silicone oil), or helium as is well known in the art.

Coolant distribution unit 21 may comprise a flexible inner plate 31 to separate the cool and warm coolant flows, and a coolant blockage plate 32. Although characterized as plates, these actually may be flat thick members formed of a tough material such as a rubber, polymer, or preferably polyurethane. Alternatively, plates 31 and 32 may be comprised of a thin, flexible, metal, such as aluminum, steel, or other metal alloys compatible with the coolant.

Multiple compliant cooling elements 41 are inserted into the coolant distribution unit 21 at various locations through openings in inner plate 31 and coolant blockage plate 32, at positions which allow the cooling elements 41 to contact devices on carrier 11 which need to be cooled. Grooves 29, in cooling elements 41 accept mating projections 36 of inner plate 31 and coolant blockage plate 32 to form a tight seal, due to the elastic nature of inner plate 31 and coolant blockage plate 32. In addition, seal rings 33 and 35, which may be O-rings, are installed around upwardly extending portions 39 of the openings in the flexible inner plate 31 and the coolant blockage plate 32 to push the material of the plates forcefully against cooling elements 41, thus providing intimate contact and further assisting in preventing leakage of the coolant. Each compliant cooling element 41 is biased downward by a spring 34 at the tip of the compliant cooling element 41. There is an optional stopper 49 on the compliant cooling elements 41 to limit the displacement of the compliant cooling elements 41. Because of the flexibility of the inner plate 31 and coolant blockage plate 32, the compliant cooling elements 41 are held in place in a somewhat floating manner and free to move laterally and perpendicularly to make good thermal contact with the chips on the multichip carrier 11.

Main bottom plate 24 is configured with cavities 51 under the coolant blockage plate 32. Cavities 51 may be used to place coolant absorbent materials 52 to reduce the chance of further coolant leakage, should a small quantity of coolant seep past seal rings 35. Such coolant absorbent materials may be any type of desiccants such as silica gel, calcium aluminosilicate, polyacrylamide, etc.

The invention provides the advantage that the compliant cooling elements 41 can be recessed during assembly by pumping out some of the air inside the coolant distribution unit 21. This may be accomplished by temporarily blocking all of coolant inlet ports 28, and coolant outlet ports 27, except for one port. A vacuum line is connected to the one unblocked port by a suitable fitting. A partial vacuum is created within unit 21, thus causing atmospheric pressure to act upon cooling elements 41, and force them toward top cover 22, thus compressing springs 34. This is a useful feature when the coolant distribution unit 21 is to be inserted into a frame 100, which houses the multichip carrier 11 and the coolant distribution unit 21, in a direction which is parallel to the plane of circuit board 12. After coolant distribution unit 21 is in place, air is allowed back into the internal chambers of coolant distribution unit 21, thus allowing springs 34 to force the cooling surfaces of cooling elements 41 into contact with the chips 14a and 14b to be cooled.

It will be understood that if coolant distribution unit 21 is to be assembled to carrier 11 in this manner, a cut out portion of bottom plate 24 must be provided, as for example, along one of its four sides that form a rectangle, so that coolant distribution unit 21 can slide over the chips on carrier 11 without striking bottom plate 24. It will also be understood that prior to assembly, a suitable heat conductive compound is applied to the cooling surfaces of cooling elements 41 to assure imitate thermal contact, and thus the lowest possible thermal resistance, as is well known in the art. For example, a heat conductive oil may be used.

As an alternative to working with air, the internal chambers of coolant distribution unit 21 may be filled with a liquid, such as, for example the liquid to be used for cooling, to perform the above assembly procedure. A device such as a power activated syringe (not shown) may be used to withdraw a predetermined volume of fluid, to recess the cooling elements by a known amount during the assembly procedure.

The coolant distribution unit 21 including the inner plates 31 and 32 can be made of materials compatible with the coolant such as metals or plastics.

Figure 2:
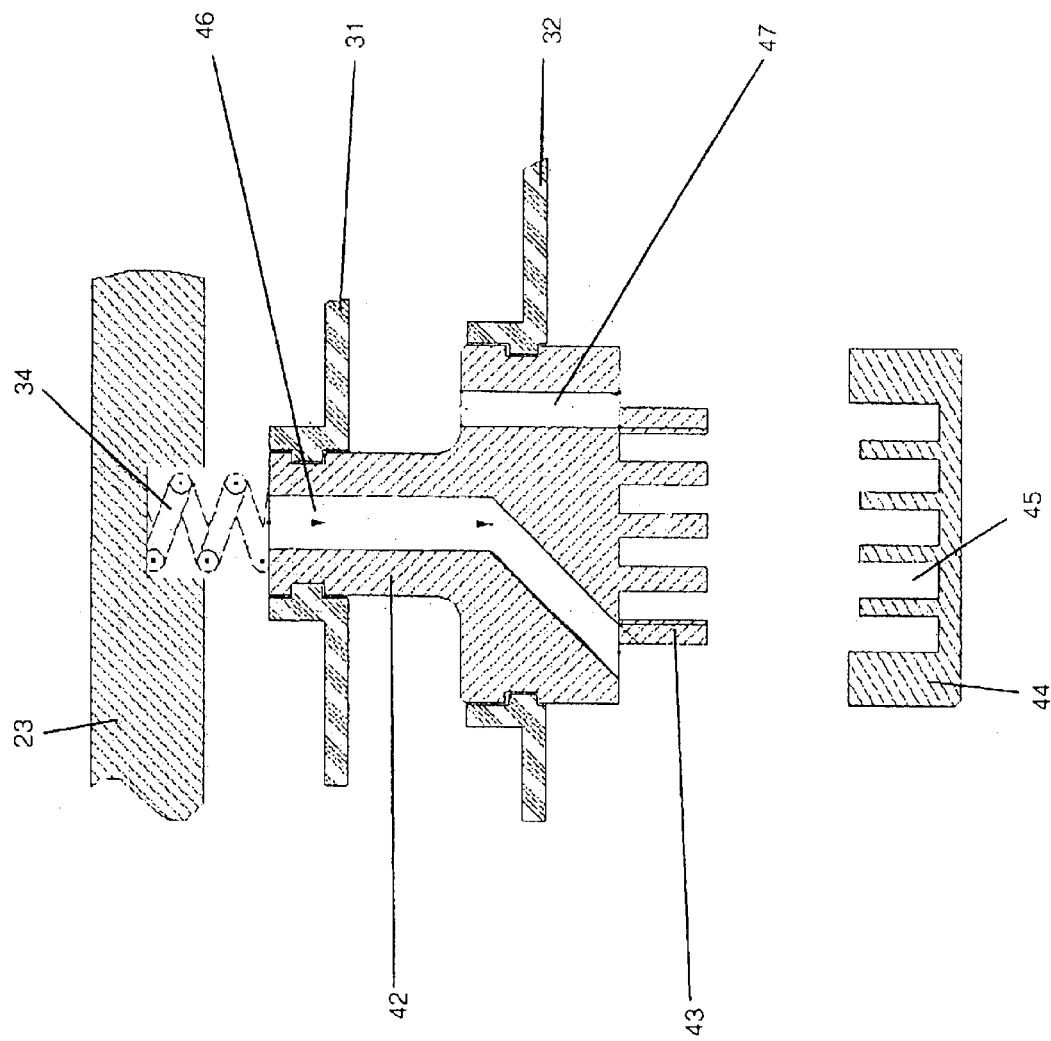
FIG. 2 is an enlarged cross-sectional view of the compliant cooling elements of shown in FIG. 1.

The detailed structure of the compliant cooling elements 41 is shown in FIG. 2, in which only major components are depicted. The compliant cooling element 41 has a main body 42 with a coolant passage 46 at the center and a coolant passage 47 at the outer edge. The main body 42 can be cylindrical, rectangular, or other suitable shape. Elements 41 may be configured with fin-like structures 43 protruding out at the bottom of the main body 42. A cooling head member 44 has multiple grooves 45 matching to the fin-like structures 43. When the cooling head member 44 is brought together with the main body 42, the fin-like structures 43 and the grooves 45 will interdigitate to form a narrow coolant path 48 as shown in FIG. 1. The main body 42 and the cooling head member 44 are made of thermally conductive materials such as copper, and mounted together by wielding, soldering, or brazing. Alternatively, the main body 42 is made of a polymer and the cooling head member 44 may be made of copper, with the two being bonded together with a suitable adhesive.

In practice, the apparatus in accordance with the invention is assembled in the following manner, with reference again to FIG. 1. First cooling elements 41 are assembled to plate 32, and seal rings 35 are put in place. This assembly is placed in bottom plate 24. Frame member 23 is placed over bottom plate 24, capturing plate 32. Then plate 31 and seal rings 33 are installed. Springs 34 are placed over cooling elements 41. Finally, main top cover 22 is placed over the assembly. The entire assembly is bolted or otherwise secured in place by fasteners or adhesive (not shown) to form coolant distribution unit 21.

In a cooling apparatus in accordance with the invention, with a water coolant flowing at 2 cc/second, at a pressure drop of 2 psi (13.8 Kpa), thermal resistance is approximately 0.27 degrees centigrade per watt per chip, for chips of 20 mm×20 mm, with an oil interface to the chips.

At an initial ambient temperature of 20 degrees centigrade, the following changes in temperature are observed as a function of power dissipated in the chips.

| Power (watts) | Temperature (C.) | Change in Temperature (C.) |
|---|---|---|
| 20 | 25.4 | 5.4 |
| 30 | 28.1 | 8.1 |
| 40 | 30.8 | 10.8 |
| 50 | 33.5 | 13.5 |
| 60 | 36.2 | 16.2 |
| 100 | 47.0 | 27.0 |

Under dry interface conditions the thermal resistance is increased by 0.02 to degrees centigrade per watt to 0.29 degrees centigrade per watt per chip.

Figure 3:
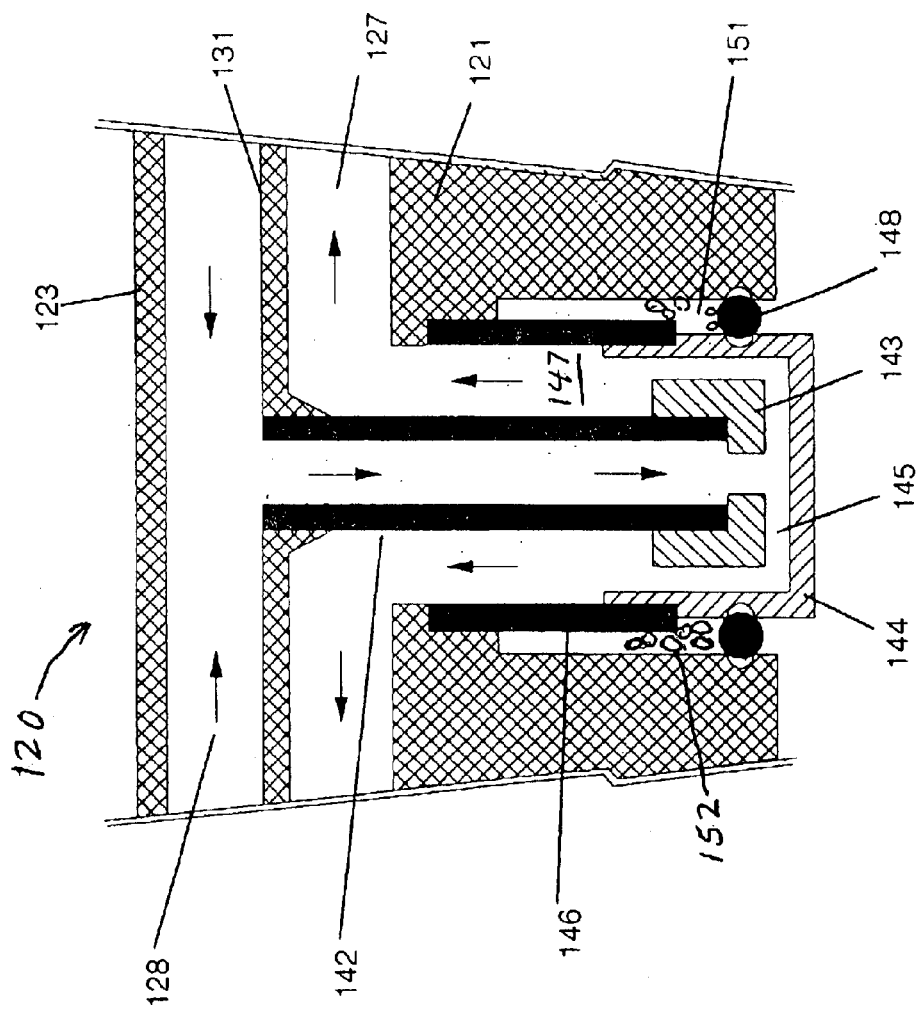
FIG. 3 is an enlarged cross-sectional view of another embodiment of the invention.

FIG. 3 shows another embodiment of the invention, wherein only one of a plurality of cooling elements is shown. The coolant distribution unit 120 comprises a cover 123, an inner plate 131 to separate the cool and warm coolant flows, and a bottom plate 121. The compliant cooling element comprises one inner tube 142, one outer tube 146, one inner cooling head 143, and one outer cooling head 144. Unheated coolant 128 comes into the inner cooling head 144 through the inner tube 142 and goes out through the passage 147 between the inner tube 142 and outer tube 146. The warm coolant from multiple compliant cool elements is collected by the warm coolant channel 127. The narrow channel 145 between the inner and outer cooling heads 143 and 144 can be designed to provide the required cooling capacity for a given coolant flow. The compressive force needed to force the outer cooling heads into good thermal contact with the chips is provided by the resilient nature of the flexible inner and outer tubes, 142 and 146 respectively. An O-ring 148, partially disposed in suitable grooves in outer cooling head 144 and the wall of an enlarged portion of the opening in bottom plate 121, is used to provide an additional barrier to prevent coolant leakage. The cavities 151 can be used to receive coolant absorbent materials 152 to mitigate any coolant leakage.

The technique described above, wherein fluid is temporarily withdrawn from the cooling apparatus during assembly to a device carrier, may also be used with this embodiment of the invention.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what we claim as new and desire to secure by Letters Patent is as follows:

1. An apparatus for cooling a plurality of devices, comprising;

a bottom plate;

a cover;

a first flexible member supported in said cover, said first flexible member having first openings therein;

a second flexible coolant blockage member supported between said cover and said bottom plate, said second flexible coolant blockage member having second openings aligned with said first openings;

respective cooling elements having first portions extending through said first openings and second portions extending through said second openings, each of said cooling elements having a cooling surface for contacting a device to be cooled;

coolant tight seals for sealing said first portions of said cooling elements to said first flexible member and said second portion of said cooling elements to said coolant blockage member; and coolant flow channels formed in said cover and said cooling elements to allow flow of coolant to cool said cooling elements.

2. The apparatus of claim 1, further comprising a mechanical bias element for biasing said cooling elements away from said cover.

3. The apparatus of claim 2, wherein said cooling elements further comprise a motion stop portion to limit movement of said cooling element away from said cover caused by said bias element.

4. The apparatus of claim 1, wherein said cover comprises:
- a cover plate; and
- a frame member, said first flexible member being supported between said cover plate and said frame member.

5. The apparatus of claim 1, wherein the coolant flow channels in each cooling element include an opening for receiving cooling fluid from said cooling channels in said cover, a serpentine coolant flow passage adjacent said surface contacting said devices to be cooled, and a coolant outlet passage for discharging coolant to flow through an outlet passage in said cover.

6. The apparatus of claim 1, wherein said cooling elements comprise a first part having a series of fins and a second part having a series of grooves, said grooves in said first part and the groves in said second part mating together to form a serpentine channel for the passage of coolant.

7. The apparatus of claim 1, wherein said coolant tight seals comprise:
- first annular grooves in said first portions of said cooling elements and second annular grooves in said second portions of said cooling elements; and
- first annular projections extending from said first flexible member into said first annular grooves, and second annular projections extending from said second flexible member into said second annular grooves.

8. The apparatus of claim 7, wherein said coolant tight seals further comprise:
- annular seal bands surrounding portions of said first flexible member and portions of said second flexible member in proximity to said projections.

9. The apparatus of claim 1, wherein said second flexible member, said bottom plate, and said cooling elements define cavities in which coolant absorbent material may be placed.

10. The apparatus of claim 9, further comprising coolant absorbent material placed in said cavities.

11. The apparatus of claim 10, wherein said coolant absorbent material is a desiccants selected from the group of silica gel, calcium aluminosilicate, and polyacrylamide.

12. The apparatus of claim 1, in combination with a carrier having thereon a plurality of devices to be cooled, at least some of said devices being disposed on the carrier so as to come into contact with said cooling surfaces of said cooling elements.

13. An apparatus for cooling a plurality of devices, comprising:
- a housing;
- a bottom plate disposed in said housing, said bottom plate having first openings therein;
- a cover plate for closing said housing;
- a second plate supported in said housing between said bottom plate and said cover plate to define a first space between said cover plate and said second plate and a second space between said second plate and said bottom plate, said second plate having second openings therein, said second openings being aligned with respective first openings;
- an outer cooling element for contacting each of the devices to be cooled;
- an outer tube for connecting each of said outer cooling elements to said bottom plate, each of said outer tubes being received in a respective one of said second openings;
- an inner cooling element received within said outer cooling element, each of said inner cooling elements having a connecting opening;
- an inner tube within each of said outer tubes for connecting each of said second cooling elements to said second openings so as to define a flow space between said inner tube and said outer tube; whereby a path for flow of coolant is defined extending along said first space, said inner tube, said connecting opening, said flow space, and said second space.

14. The apparatus of claim 13, wherein said second openings have an enlarged region to define an annular space between said outer tube and said bottom plate, further comprising a, seal disposed between said outer cooling element and a wall of said enlarged region to close said annular space.

15. The apparatus of claim 14, further comprising a coolant absorbing material disposed in said annular space.

16. The apparatus of claim 15, wherein said coolant absorbent material is a desiccants selected from the group of silica gel, calcium aluminosilicate, and polyacrylamide.

17. The apparatus of claim 14, wherein said outer cooling elements and said walls of said second opening are each configured with corresponding annular grooves, and said seal comprises an O-ring having portions disposed in said grooves.

18. The apparatus of claim 13, wherein said inner tubes and said outer tubes are comprised of a resilient material.

19. A method of assembling a cooling apparatus to a carrier having devices to be cooled, the method comprising:
- partially evacuating at least one chamber in said cooling apparatus so as to move cooling elements in a direction and to a position wherein cooling surfaces of said cooling devices can not contact said devices when said cooling apparatus and said carrier are assembled;
- placing said cooling apparatus over said carrier; and
- allowing fluid to enter said at least one chamber so that said cooling surfaces are forced into contact with said devices.

20. The method of claim 19, wherein said cooling apparatus is placed over said carrier by sliding said cooling apparatus and said carrier with respect to one another in a direction parallel to a plane of said carrier.

* * * * *